United States Patent [19]

Heywang et al.

[11] Patent Number: 4,849,492

[45] Date of Patent: Jul. 18, 1989

[54] POLYHYDANTOINS CONTAINING SULPHONE GROUPS

[75] Inventors: Gerhard Heywang, Bergisch Gladbach; Friedrich Jonas, Aachen; Rudolf Merten; Werner Schmidtberg, both of Leverkusen, all of Fed. Rep. of Germany

[73] Assignee: Bayer Aktiengesellschaft, Leverkusen, Fed. Rep. of Germany

[21] Appl. No.: 251,624

[22] Filed: Sep. 29, 1988

[30] Foreign Application Priority Data

Oct. 8, 1987 [DE] Fed. Rep. of Germany ....... 3734040

[51] Int. Cl.$^4$ .............................................. C08G 18/28
[52] U.S. Cl. ........................................ 528/48; 528/49; 528/53; 528/54; 528/55; 528/57; 528/62; 528/68; 528/73
[58] Field of Search ............... 528/62, 68, 73, 48, 528/49, 53, 55, 54, 57

[56] References Cited

U.S. PATENT DOCUMENTS

| | | | |
|---|---|---|---|
| 3,397,253 | 8/1968 | Merten et al. | 427/388.1 |
| 3,549,599 | 12/1922 | Merten | 528/73 |
| 3,676,455 | 7/1972 | Haug et al. | 548/310 |
| 3,681,282 | 8/1972 | Preston | 528/28 |
| 3,684,774 | 8/1972 | Merten et al. | 548/310 |
| 3,876,584 | 4/1975 | Okada et al. | 528/328 |
| 3,915,938 | 10/1975 | Mazaki et al. | 528/45 |
| 3,939,122 | 2/1976 | Merten et al. | 528/45 |
| 4,005,056 | 1/1977 | Dunwald et al. | 528/45 |
| 4,702,953 | 10/1987 | Jonas et al. | 428/209 |

FOREIGN PATENT DOCUMENTS

292150 7/1971 Austria.
2009741 9/1971 Fed. Rep. of Germany.
1795751 8/1974 Fed. Rep. of Germany.

Primary Examiner—Maurice J. Welsh
Assistant Examiner—L. Henderson
Attorney, Agent, or Firm—Sprung Horn Kramer & Woods

[57] ABSTRACT

Polyhydantoins of the general formula

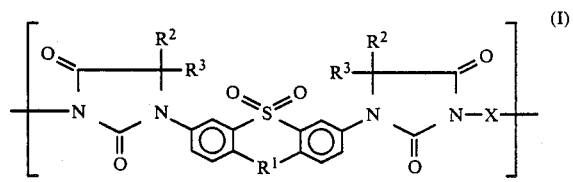

in which
X stands for a bivalent aliphatic, aromatic or araliphatic radical,
$R^1$ denotes —$CH_2$—,

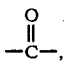

—O—, —$SO_2$—, —$C(R^5,R^6)$
$R^2$ and $R^3$ are identical or different and stand for hydrogen, $C_1$–$C_6$-alkyl or together stand for —$(CH_2)_4$— or —$(CH_2)_5$— and
$R^5$ and $R^6$ are identical or different and stand for $C_1$–$C_6$-alkyl or together stand for —$(CH_2)_4$— or —$(CH_2)_5$—,
are valuable high temperature-resistant polymers, which have utility in particular as film materials.

20 Claims, No Drawings

POLYHYDANTOINS CONTAINING SULPHONE GROUPS

BACKGROUND OF THE INVENTION

Polymers containing hydantoin groups and processes for their preparation have already been disclosed (DE-AS (German Published Specification) No. 1,570,552 and DE-AS (German Published Specification) No. 1,795,751). They are used as temperature-resistant wire enamels or for the production of temperature-resistant films. In spite of the remarkable property level of these polyhydantoins, they are not suited for all uses in the modern electronics industry. Thus, high temperature-resistant films are required for flexible printed circuit boards in electronic circuits. Such films are permitted to exhibit only a very low shrinkage during processing at temperatures above 200° C. in a solder bath. However, this requirement is only inadequately fulfilled by films of hitherto known polyhydantoins. The desire therefore existed to develop polyhydantoins which exhibit only a very small shrinkage at temperatures above 200° C.

SUMMARY OF THE INVENTION

Surprisingly, it has been found that polyhydantoins of the formula (I) shown below, which contain sulphone groups, exhibit such a high temperature resistance as required.

The invention therefore relates to polyhydantoins of the formula

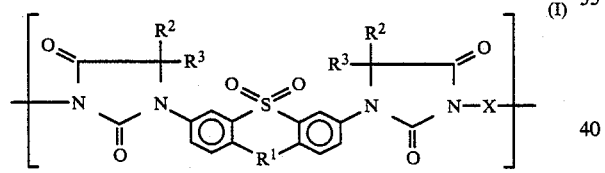
(I)

in which
X stands for a bivalent aliphatic, aromatic or araliphatic radical,
$R^1$ denotes —$CH_2$—,

—O—, —$SO_2$—, $C(R^5R^6)$
$R^2$ and $R^3$ are identical or different and stand for hydrogen, $C_1$–$C_6$-alkyl or together stand for —$(CH_2)_4$— or —$(CH_2)_5$— and
$R^5$ and $R^6$ are identical or different and stand for $C_1$–$C_6$-alkyl or together stand for —$(CH_2)_4$— or —$(CH_2)_5$.

DETAILED DESCRIPTION OF THE INVENTION

Preferred polyhydantoins according to the invention are those of the formula (I) in which $R^1$ denotes —$CH_2$—, —O— or —$C(CH_3)_2$—.

Further preferred polyhydantoins according to the invention are those of the formula (I) in which $R^2$ and $R^3$ stand for hydrogen, methyl or ethyl.

Still further preferred polyhydantoins of the formula (I) according to the invention are those in which X stands for one for the following radicals:

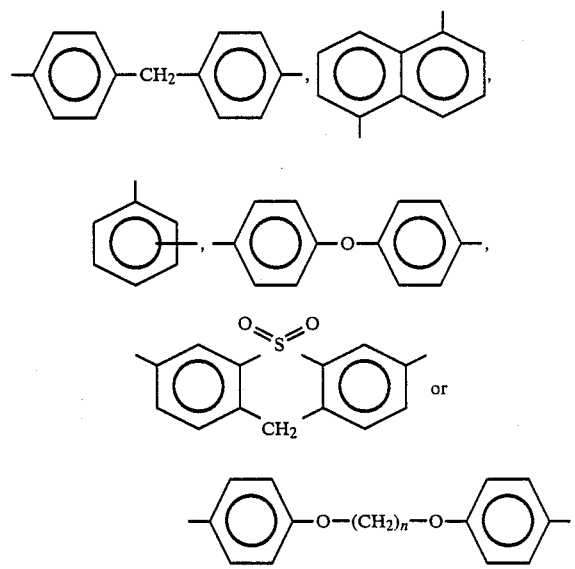

having n=2–6.

All polyhydantoins according to the invention are characterized by the sulphone group evident from formula (I)

For the preparation of the polyhydantoins according to formula (I), a procedure can thus be used in which bisglycine esters of the formula

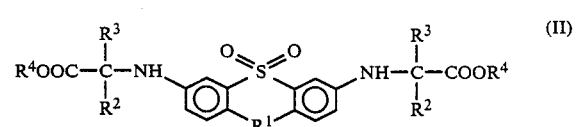
(II)

in which
$R^1$, $R^2$ and $R^3$ have the abovementioned meaning and $R^4$ stands for $C_1$–$C_{10}$-alkyl or $C_6$–$C_{10}$-aryl,
are reacted with diisocyanates to give substituted ureas and these are subsequently cyclized to the polyhydantoins with the elimination of alcohol.

The preparation of the glycine derivatives to be used as starting materials is known in principle and can take place, for example, by direct reaction of the diamines

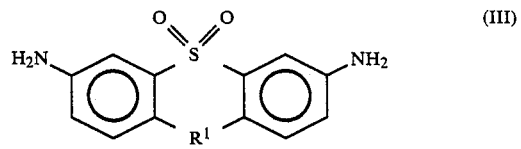
(III)

in which
$R^1$ has the meaning given above,
with halogenoacetic acid or its derivatives.

The reaction with halogenoacetic acid or its derivatives takes place in organic solvents, for example in ethanol, methanol, acetone or benzene, and also in aqueous media with the additional use of acid scavengers, such as tertiary amines (pyridine, teriethylamine and the like), excess starting amine, sodium carbonate, potassium carbonate, sodium hydrogen carbonate, potassium hydrogen carbonate, sodium hydroxide, calcium oxide, calcium carbonate or similar substances known for these purposes to one skilled in the art.

Suitable halogenoacetic acid or its derivatives, are, for example chloroacetic acid, chloroacetamide, N,N-dialkylchloroacetamide (having methyl, ethyl or butyl as alkyl groups), chloroacetic acid esters (having methyl ethyl, phenyl or the like as ester groups), α-chloropropionic acid esters or α-chloropropionic acid.

A further method for the preparation of the bisglycine esters of the formula (II) consists of the condensation of the diamines (III) with cyanides, for example sodium cyanide or potassium cyanide and oxo compounds (such as formaldehyde, acetone, cyclohexanone and the like) with the addition of acids; the nitriles obtained can then be hydrolysed to carboxylic acids in a known manner or directly converted into the ester using the desired alcohol and acids such as HCl.

Further processes consists of the conversion of already prepared glycine derivatives, for example an esterification of the free acids.

The diisocyanates required for the preparation of the polyhydantoins are those of the formula $$OCN-X-NCO \quad (IV)$$

in which

X has the meaning given above.

Examples thereof are polymethylene diisocyanates $OCN-(CH_2)_n-NCO$ having values for n from 4 to 8, if appropriate alkyl-substituted phenylene diisocyanates, such as m- and p-phenylene diisocyanates, toluene-2,4-diisocyanate and toluene-2,6-diisocyanate, ethylphenylene diisocyanate, di- and triisopropylphenylene diisocyanates, chloro-p-phenylene diisocyanates, diphenylmethane diisocyanates, naphthylene diisocyanates, diphenyl ether diisocyanates or thioxanthene-S,S-dioxide diisocyanates.

The said diisocyanates can also be employed in the form of derivatives. In this case, suitable derivatives are, for example, the reaction products of such diisocyanates with compounds such as phenols, alcohols, amines, ammonia, disulphide and HCl. Individual representatives of these compounds which may be mentioned are, for example: phenol, cresols, xylenols, ethanol, methanol, propanol, isopropanol, ammonia, methylamine, ethanolamine, dimethylamine, aniline and diphenylamine. Furthermore, higher molecular weight adducts, for example of diisocyanates with polyalcohols, such as ethylene glycol or propylene glycol can also be used.

The process is in general carried out in such a way that the two starting components of the formulae (II) and (IV) are heated for a relatively long time.

In this case, essentially equimolar amounts of the diisocyanate and the bisglycine ester are employed. Small variations are permissible, for example 0.8-2.0 moles, preferably 0.9-1.2 moles of diisocyanate per mole of the bisglycine ester.

With excess amounts of the diisocyanate and insofar as this is liquid, the additional use of a solvent or diluent as the reaction medium can be avoided. However, it is preferred to work in a solvent or diluent, where in a preferred manner such a solvent/diluent is selected in which the resultant polymer dissolves. The polymer can then be isolated by removing the solvent/diluent and, if appropriate, the excess diisocyanate by distillation. Furthermore, the polymer can be isolated by addition of a precipitating agent. Such precipitating agents are, for example, aliphatic alcohols, such as methanol and ethanol, propanol or water. Such a precipitation is preferably used when the polymer solution contains no free isocyanate groups.

Suitable solvents or diluents are those which are inert towards the NCO groups and dissolve the resultant polymers in a preferred manner, such as chlorinated aromatic hydrocarbons, aliphatic hydrocarbons, esters and ketones, and furthermore N-alkylpyrrolidones, dimethyl sulphoxide, phenol, cresols and dimethylformamide. N-Alkylpyrrolidones, dimethyl sulphoxide, phenol, cresols and dimethylformamide, if appropriate mixed with an aromatic hydrocarbon, are preferred solvents.

When using the abovementioned derivatives of isocyanates, other solvents, for example alcohols, can also be used.

The formation of the hydantoin ring can be represented, for example, according to the following equation:

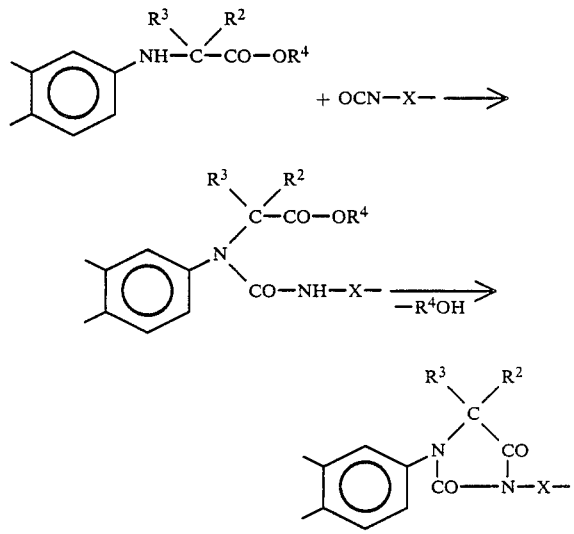

Suitable reaction temperatures, depending on the starting material selected, are those from 80° to 300° C., preferably 100°-280° C., particularly preferably 120°-250° C. In a manner known to one skilled in the art, the reaction can be carried out at the higher of the said temperatures under pressure, in order to keep the solvent or diluent and the other reactants in the liquid phase.

The condensation reaction for the formation of the polyhydantoins of the formula (I) can be accelerated by the additional use of metal alkoxides, such as sodium methoxide, sodium ethoxide, titanium tetrabutoxide, or tertiary amines, such as triethylamine and endoethylenepiperazine, as catalysts.

The polyhydantoins containing sulphone groups according to the invention are high temperature-resistant plastics, which remain stable up to about 350° C. and possess excellent mechanical properties. They can contain the customary additives for plastics, such as fillers, pigments, antioxidants and softeners inter alia. Furthermore, other polymers, such as polyesters, polyamides, polyurethanes, polyolefins, polyacetals, polyepoxides, polyimides, polyamidimides, polyimino polyesters and polyimidoisocyanates can be admixed with the polyhydantoins according to the invention, by means of which the spectrum of properties can be adapted to further requirements.

The polyhydantoins containing sulphonyl groups of the formula (I) according to the invention are outstandingly suitable for the production of thermostable shaped articles, in a preferred manner for the production of films, which in particular exhibit only a low shrinkage at high usage and processing temperatures. Such films find use, for example, in the electrical and electronics industries, for example for the production of flexible printed circuit boards.

EXAMPLE 1

104.12 parts by weight of 3,6-diaminothioxanthene-S-dioxide, 400 parts by weight of methanol and 136 parts by weight of acetone cyanohydrin were heated under reflux for 24 hours. After cooling to 10° C., the resultant precipitate was filtered off with suction and recrystallized from acetonitrile.

After drying, 88.2 parts by weight of N,N'-bis-(2-cyanopropyl-2)-3,6-diaminothioxanthene-S-dioxide of the formula

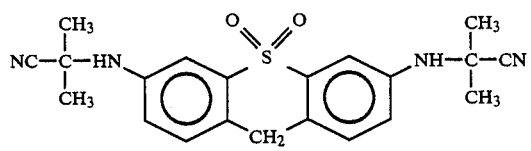

were obtained of m.p. 174°–5° C.

Combustion analysis: Calc.: C: 63.9% H: 5.6% N: 14.2% S: 8.1%. Found: C: 63.9% H: 5.5% N: 14.2% S: 8.2%.

EXAMPLE 2

139 parts by weight of N,N'-bis-(2-cyanopropyl-2)-3,6-diaminothioxanthene-S-dioxide were introduced into a cooled flask of 423 parts by weight of 96% strength sulphuric acid and 350 parts by weight of methylene chloride. After removing the methylene chloride by distillation, 132 parts by weight of methanol were added at 60°–80° C. The mixture was stirred for a further 20 hours at 80° C., subsequently poured into 2 l of ice water and neutralized with dilute sodium hydroxide solution.

The white product precipitated was filtered off with suction and recrystallized from dioxane after drying.

88 parts by weight of N,N'-bis-(2-carboxymethylpropyl-2)-3,6-diaminothioxanthene-S-dioxide of the formula

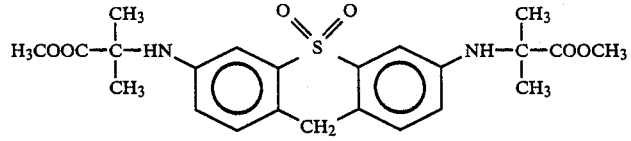

were obtained of m.p.: 220° C.

Combustion analysis: Calc.: C: 60% H: 6.1% N: 6.1% S: 7.0%. Found: C: 59.9% H: 6.0% N: 6.1% S: 7.0%.

EXAMPLE 3

0.05 parts by weight of endoethylenepiperazine and 12.5 parts by weight of 4,4'-diisocyanatodiphenylmethane are added to 23.03 parts by weight of N,N'-bis-(2-carbomethoxypropyl-2-)-3,6-diaminothioxanthene-S-dioxide, dissolved in 75.6 parts by weight of cresol and 10 parts by weight of toluene and the mixture is condensed at 210° C. over 8 hours. The solution of the polyhydantoin exhibited a viscosity of 7,600 mPas (25° C.) after diluting with the same amount of cresol.

A lacquer film baked onto a steel sheet at 300° C. showed a smooth, pale surface of good elasticity.

By pouring into methanol, the polymer was precipitated. 31 parts by weight of a yellowish, coarsely pulverulent material, which exhibited the typical bands for a hydantoin in the IR spectrum were obtained.

Production of the film:

15 parts by weight of the precipitated material were dissolved in 85 parts by weight of methylene chloride, deaerated and stripped down to a film on a glass sheet. After the evaporation of solvent, the film was stripped off and dried at 160° C. for 1 hour. A 10 cm long strip of film showed no shrinkage in a metal bath at 260° C. A polyhydantoin produced according to DAS (German Published Specification) No. 1,795,751, Example 11 was processed into a film according to the above example. A 10 cm long strip of foil showed a shrinkage of 5% at 260° C. in a metal bath.

EXAMPLES 4 TO 6

The following combinations (in parts by weight) were converted into polyhydantoin plastics via cresol solution analogously to Example 1.

| No. 4 | 23.03 parts by weight of N,N'—bis-(2-carbomethoxypropyl-2)-3,6-diaminothioxanthene-S—dioxide 15.61 parts by weight of 3,6-diisocyanato-thioxanthene-S—dioxide; |
|---|---|
| No. 5 | 23.03 parts by weight of N,N'—bis-(2-carbomethoxypropyl-2)-3,6-diaminothioxanthene-S—dioxide 12.61 parts by weight of 4,4'-diisocyanato-diphenyl ether; |
| No. 6 | 23.03 parts by weight of N,N'—bis-(2-carbomethoxypropyl-2)-3,6-diaminothioxanthene-S—dioxide 10.51 parts by weight of 1,5-diisocyanato-naphthalene |

The polyhydantoin lacquers according to Example 4 to 6 were baked onto steel sheets at 300° C. The lacquer films thus obtained showed smooth surfaces having good elasticity.

What is claimed is:

1. Polyhydantoins of the general formula

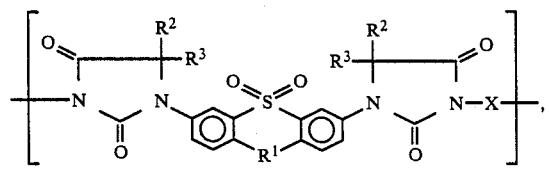

in which

X stands for a bivalent aliphatic, aromatic or araliphatic radical,

R¹ denotes —CH₂—,

—O—, —SO₂—,

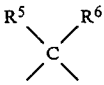

R² and R³ are identical or different and stand for hydrogen, C₁-C₆-alkyl or together stand for —(CH₂)₄— or —(CH₂)₅— and R⁵ and R⁶ are identical or different and stand for C₁-C₆-alkyl or together stand for —(CH₂)₄— or —(CH₂)₅—.

2. Polyhydantoins according to claim 1, wherein R¹ denotes —CH₂—, —O— or —C(CH₃)₂—.

3. Polyhydantoins according to claim 1, wherein R² and R³ are identical or different and stand for hydrogen, methyl or ethyl.

4. Polyhydantoins according to claim 1, wherein X stands for one of the radicals

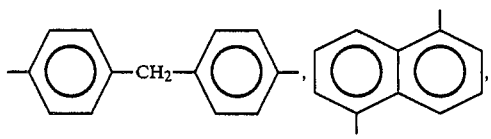

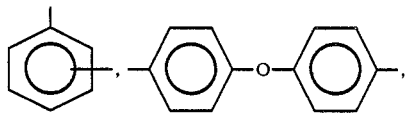

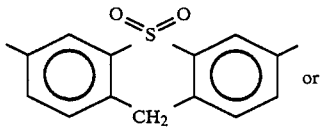

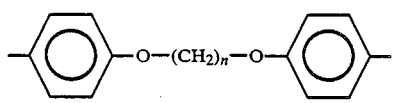

having n=2-6.

5. A process for the preparation of the polyhydantoins according to claim 1, characterized in that bisglycine esters of the formula

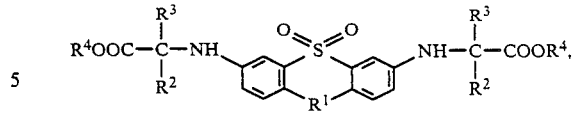

in which

R¹, R² and R³ have the meanings mentioned in claim 1 and

R⁴ stands for C₁-C₁₀-alkyl or C₆-C₁₀-aryl, are reacted with diisocyanates to give substituted ureas and these are subsequently cyclized with elimination of alcohol.

6. A process according to claim 5, characterized in that 0.5–10 moles of diisocyanate per mole of the bisglycine ester are employed.

7. A process according to claim 6, characterized in that 1–3 moles of diisocyanate per mole of the bisglycine ester are employed.

8. A process according to claim 5, characterized in that the reaction is carried out in a solvent or diluent.

9. A process according to claim 8, characterized in that N-alkyl-pyrrolidones, dimethyl sulphoxide, phenol, cresols or dimethylformamide are employed as solvents or diluents.

10. A process according to claim 9, characterized in that the N-alkyl-pyrrolidones, dimethyl sulphoxide, phenol, cresols or dimethylformamide are employed with admixed aromatic hydrocarbons.

11. A process for the production of temperature-resistant shaped articles, characterized in that polyhydantoins according to claim 1 are employed.

12. A process according to claim 11, characterized in that the shaped articles are temperature-resistant films.

13. A process according to claim 5, characterized in that the diisocyanates are those of the formula

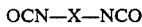

OCN—X—NCO in which

X stands for a bivalent aliphatic, aromatic or araliphatic radical.

14. A process according to claim 6, characterized in that 0.8–2 moles of diisocyanate per mole of the bisglycine ester are employed.

15. A process according to claim 6, characterized in that 0.9–1.2 moles of diisocyanate per mole of the bisglycine ester are employed.

16. A process according to claim 5, characterized in that the polyhydantoins are recovered by precipitation with the aid of a precipitating agent.

17. A process according to claim 16, characterized in that the precipitating agent is an aliphatic alcohol or water.

18. A process according to claim 5, characterized in that it is carried out at a temperature of 80°–300° C.

19. A process according to claim 5, characterized in that it is carried out with the additional use of a metal alkoxide or a tertiary amine.

20. A process according to claim 19, characterized in that the metal alkoxide is sodium methoxide, sodium ethoxide or titanium tetrabutoxide and the tertiary amine is triethylamine or endoethylene-piperazine.

* * * * *